United States Patent [19]
Nelson et al.

[11] Patent Number: 5,814,433
[45] Date of Patent: Sep. 29, 1998

[54] USE OF MIXTURES OF ETHYL LACTATE AND N-METHYL PYROLLIDONE AS AN EDGE BEAD REMOVER FOR PHOTORESISTS

[75] Inventors: William C. Nelson, Whitehouse Station; Octavia Lehar, Flemington, both of N.J.

[73] Assignee: Clariant Finance (BVI) Limited, Virgin Islands (Br.)

[21] Appl. No.: 833,170

[22] Filed: Apr. 3, 1997

Related U.S. Application Data

[60] Provisional application No. 60/017,451 May 17, 1996.
[51] Int. Cl.$^6$ ....................................................... G03F 7/38
[52] U.S. Cl. ........................... 430/326; 430/192; 430/325; 430/326; 430/330; 430/331
[58] Field of Search .................................. 430/325, 326, 430/331, 192, 330

[56] References Cited

U.S. PATENT DOCUMENTS

| | | | |
|---|---|---|---|
| 4,886,728 | 12/1989 | Salamy et al. | 430/331 |
| 4,983,490 | 1/1991 | Durham | 430/169 |
| 5,039,594 | 8/1991 | Durham | 430/326 |
| 5,151,219 | 9/1992 | Salamy et al. | 252/364 |
| 5,362,608 | 11/1994 | Flaim et al. | 430/331 |
| 5,426,017 | 6/1995 | Johnson | 430/331 |
| 5,637,436 | 6/1997 | Johnson | 430/331 |

OTHER PUBLICATIONS

Lattice Press, 1986, "Silicon Processing for the VLSI ERA, vol. 1: Process Technology" S. Wolf and R.N. Tauber, pp. 429–434.

Semiconductor International, Feb. 1988, "Applying Photoresist for Optimal Coatings", K. Skidmore, pp. 57–62.

Sematech, Chemical and Physical Properties of Semiconductor Process Chemicals, 93081774A–TR, Oct. 1993.

Defect Density Reduction Uitlizing Wafer Edge Resist Removal, Microcontamination, N. Durant and P. Jenkins, Apr. 1985, pp. 45–51.

"Encylopedia of Occupational Health and Safety" (Ed L., Geneva Switzerland, 3rd Edition, 1989) pp. 2065–2069, L. Parmeggian.

Derwent, JP 6184595 Jul./94, Nitto Chemical Ind. Co. Ltd.

Derwent, JP 6212193 08/94, Magase denshi Kagaku KK and Nitto Chemical Ind. Co.

"American Industrial Hygiene Assoc.: Odor Thresholds for Chemicals with Established Occupational Health Standards", Akron, OH, Handbook of Chemistry and Physics, 1983–1984, Boca Raton, FL.

Air & Waste management Association, J. Air Waste Management Assoc., Oct. 1991, vol. 41, No. 10, pp. 1360–1363, "The Odor Impact Model" G.Z. Nagy.

*Primary Examiner*—John S. Chu
*Attorney, Agent, or Firm*—Sangya Jain

[57] ABSTRACT

The invention provides a process for removing unwanted photoresist material from the periphery of a photoresist-coated substrate using a solvent composition of ethyl lactate and N-methyl pyrollidone, where the amount of N-methyl pyrollidone ranges from about 3% to about 20% by weight of the total composition, and where the solvent composition has a flash point of greater than 100° F. (38° C.), has an odor threshold value greater than 5000, is effective as both a backside and topside edge bead remover and can effectively remove the edge bead from an unbaked or baked photoresist film.

14 Claims, No Drawings

5,814,433

USE OF MIXTURES OF ETHYL LACTATE AND N-METHYL PYROLLIDONE AS AN EDGE BEAD REMOVER FOR PHOTORESISTS

This application claims the benefit of U.S. Provisional Application No. 60/017,451 Filing Date 17, May 1996.

BACKGROUND OF THE INVENTION

The present invention relates generally to the field of microelectronics, e.g., integrated circuits, and more particularly to compositions and methods for removing photoresist compositions from the surfaces of substrates, e.g., silicon wafers, used in the fabrication of integrated circuits. In its most particular regard, the invention relates to compositions and methods for removing unwanted edge residues of photoresist composition from a wafer which has been spin-coated with photoresist.

In very general terms, the fabrication of integrated circuits involves steps for producing polished silicon wafer substrates, steps for imaging integrated circuit pattern geometries on the various wafer surfaces, and steps for generating the desired pattern on the wafer.

The imaging process involves the use of photoresists applied to the wafer surface. Photoresists are compositions which undergo change in response to light of particular wavelength such that selective exposure of the composition through a suitable patterned mask, followed by development to remove exposed or non-exposed portions of the photoresist as the case may be, leaves on the wafer a pattern of resist which replicates either the positive or negative of the mask pattern, and which thus permits subsequent processing steps (e.g., deposition and growth processes for applying various layers of semiconductive materials to the wafer and etching-masking processes for removal or addition of the deposited or grown layers) to be carried out in the desired selective pattern.

The photoresists used in the imaging process are liquid compositions of organic light-sensitive materials which are either polymers per se or are used along with polymers, dissolved in an organic solvent. Critical to the effectiveness of the selective light exposure and development in forming a resist pattern on the wafer substrate is the initial application of the photoresist composition in a thin layer of essentially uniform thickness on the wafer surface. The coating process of choice in the industry is spin-coating. In this process, the flat circular silicon wafer on which has been deposited a predetermined volume of photoresist composition is subjected to high-speed (e.g., 500 to 6000 rpm) centrifugal whirling to cause the photoresist to spread out evenly as a layer along the wafer surface and such that excess photoresist is spun off the edges of the wafer.

Spin-coating per se is well-known in the art, as is the equipment for such coating and the process conditions employed therein, e.g., to bring about coatings of particular thickness. See, e.g., 5. Wolf and R. N. Tauber, "Silicon Processing For The VLSI Era", volume 1 (Process Technology) (Lattice Press, Sunset Beach, Calif. 1986), incorporated herein by reference, and Skidmore, K., "Applying Photoresist For Optimal Coatings", Semiconductor International, February 1988, pp. 57–62, also incorporated herein by reference.

Despite its widespread use, certain undesirable results also accompany spin-coating. Thus, owing to the surface tension of the resist composition, some of the resist may wick around to and coat the back side edge of the wafer during the spin-coating process. Also, as the spin-coating process progresses, the resist becomes progressively more viscous as solvent evaporates therefrom and resist being spun off the wafer in the latter stages of the process can leave fine whiskers ("stringers") of resist which dry on the edge of the wafer. So too, as the resist continues to dry and increase in viscosity during the spin-coating process, excess resist is less likely to leave the wafer and instead builds up as an edge-bead at the outer reaches of the wafer surface.

These coating-related problems can cause significant difficulties in the overall integrated circuit fabrication process. Resist on the back side of the wafer can be deposited elsewhere and cause contamination, and also prevents the wafer from lying flat on ultraflat surfaces, thereby affecting focus, alignment, planarity, and the like, in subsequent imaging steps. Whiskers on the wafer edges can easily break off in subsequent processing steps and cause particulate contamination in virtually all of the manufacturing equipment. Finally, the edge-bead leads to a distorted surface which can greatly affect focus, alignment, planarity and the like.

The art is aware of the problems associated with residual resist at the edges and sides of the wafer, and generally seeks to overcome them by application at the edge of the wafer of a small stream of a solvent for the resist so as to dissolve and remove the unwanted residue. In many cases, the solvent stream is applied to the backside edge of the wafer and is permitted to wick around by capillary action to the front edges so as to remove backside edge residue, whiskers and edge bead. With certain newer equipment, it is possible to apply the solvent stream from both front and back sides of the wafer simultaneously. In all cases, the object essentially is to remove from the wafer a strip of resist which is adhered to the wafer sides, the back surface outer edges of the wafer, and the outer edges of the front surface of the wafer, to leave as defect-free a film as possible. See in this regard, Wolf and Tauber, supra Skidmore, ~ura; and N. Durrant and P. Jenkins, "Defect Density Reduction Utilizing Wafer Edge Resist Removal", Microcontamination, April 1985, pp. 45–51, incorporated herein by reference.

Solvent compositions are known which may be used for thinning photoresist compositions, stripping undesired cured and uncured photoresist from wafers, removing undesired edge bead from spun photoresist wafers and cleaning related photoresist processing equipment. However, such compositions are generally extremely toxic, ecologically undesirable and/or are unpleasantly odorous. The odor of any chemical compound, especially one used in enclosed environments such as a fabrication laboratory for integrated circuits, has become an important selection criterion for all organic solutions. Chemicals introduced into these laboratories are required to have as high a value of odor threshold as possible, that is, maximum amount of solvent vapor in the environment without causing any deleterious health effects. Extensive literature is available that measures and analyses the levels and health effects of numerous organic solvents. The following references are examples of the literature, and are incorporated herein by reference: 1) Parmeggian L. *Encyclopedia of Occupational Health and Safety* (Ed L., Geneva, Switzerland, 3rd edition, 1989) pages 2065–69; 2) Sematech document, "Chemical and Physical Properties of Semiconductor Chemicals", 10193; 3) Nagy, G. "J. Air Waste Management", Vol. 41, No. 10, October 1991, pages 1360–1363; and 4) American Industrial Hygiene Association: Odor Thresholds for Chemicals with Established Occupational Health Standards, Akron, Ohio, AIHA. 1989, CRC Press, *Handbook of Chemistry and Physics,* 64th Edition 1983–1984, Boca Raton, Fla. In addition, due to the difficulties encountered in the safe handling and transportation of solvents it is critical that the flash point of these solvents be such that they be classified as combustible, rather than flammable solvents. Generally speaking, the differentiation point between flammability and combustibility is 100° F.

(38° C.). Therefore, solvent compositions with a flash point greater than 100° F. (38° C.)are greatly desired.

Edge bead removers that are known, however, do not satisfy all the criteria mentioned above. These generally contain mixtures of solvents that have odor threshold values that are unexceptable, e.g. methyl ethyl ketone (4800), n-butyl acetate (1000), ethoxy ethyl propionate (110) and cyclohexanone (3850). Solvent compositions that have values greater than about 5000 are considered to be at a level acceptable enough to be tolerable in a working environment, although the higher the value, the more preferred the solvent is. Solvents that have odor values greater than 5000 are, for example, acetone (40,000), ethyl lactate ($7.3 \times 10^5$), 2-pentanone (11902) and N methyl pyrollidone (41000). However, it has been found that although these solvents have a high odor threshold, they, as single solvents, do not serve the purpose of functioning effectively as an edge bead remover.

The present invention seeks to solve the aforementioned disadvantages. The primary object of the present invention is to provide a solvent composition for use in edge residue removal processes in integrated circuit and related fabrication sequences, which has a suitably high flash point (i.e., greater than 100° F. (38° C.)), which efficiently and effectively removes the resist residue in question even when applied in a backside as well as a topside solvent application technique, can be effective on an unbaked and a softbaked photoresist and most of all has a odor threshold value greater than about 5000, preferably 10,000 and more preferably greater than 50,000.

A solvent composition that is capable of fulfilling all of the above requirements has been found to be a mixture of ethyl lactate and N-methy pyrollidone, where the amount of N-methyl pyrollidone ranges from about 3% to to about 20%, preferably about 5% to about 15% and more preferably about 6% to about 10%. Patent applications filed by Nagase Denshi and Nitto Chem, JP 6184595 and JP 6212193, and incorporated herein by reference, describe mixtures of solvents, but these have been claimed to be effective only as a cleaning agent for removing photoresists and functioning as release agents and no process or efficacy of use for these solvent mixtures as edge bead removers that must satisfy the many criteria listed above, has been described.

SUMMARY OF INVENTION

The invention provides a process for removing unwanted photoresist material from the periphery of a photoresist-coated substrate using a solvent composition of ethyl lactate and N-methyl pyrollidone, where the amount of N-methyl pyrollidone ranges from about 3% to about 20% by weight of the total composition, preferably about 5% to about 15% by weight, and more preferably about 6% to about 10% by weight, and where the solvent composition has a flash point of greater than 100° F. (38° C.), has an odor threshold value greater than 5000, is effective as both a backside and topside edge bead remover and can effectively remove the edge bead from an unbaked or baked photoresist film. Furthermore this invention provides for the use of the above solvent composition in a edge bead removal process.

DETAILED DESCRIPTION OF THE INVENTION

The term "edge residue" is used herein generically to describe unwanted photoresist composition adhered to the outer peripheral edges of the front and back planar surfaces of the wafer substrate and to the side surfaces of the wafer substrate, whether in the form of stringers, a thickened edge bead, or simply a coating of resist, as a consequence of the spin-coating process.

The choice of solvents and solvent mixtures for use in removing residual edge resist from wafers spin-coated with positive-working photoresist compositions is quite large when viewed in terms of potentially sufficient dissolving ability to achieve the desired goal. According to the present invention, however, additional constraints are imposed on the solvent for removal of residual resist, including high flash point (greater than 100° F. (38° C.)), low toxicity, low cost, reasonable volatility, wide availability, odor threshold value greater than 5000 to provide an acceptable working environment, and effectiveness in removal of resist on the front and back side edges of the wafer substrate for a baked or unbaked resist coating.

The solvent compositions of this invention that are useful for the effective edge bead removal process comprise mixtures of ethyl lactate and N-methyl pyrollidone. Both of these solvents have the desired characteristics of having an odor threshold value of greater than 5000 (ethyl lactate $7.3 \times 10^5$, N-methyl pyrollidone 41000). The flash point of these mixtures is greater than 100° F. (38° C.), as is given in Table 1. The amount of N-methyl pyrollidone in the solvent mixtures of the invention, range from about 3 weight % to less than 20 weight %. Solvent composition containing less than 3 weight % of N-methyl pyrollidone are not effective in removing the edge residue and solvent compositions containing greater than 20 weight % of N-methyl pyrollidone can leave too much residual solvent on the resist film, although the efficacy of the edge bead removal process is dependant on the specific conditions of the lithographic process used.

Suitable substrates include silicon, aluminum, polymeric resins, silicon dioxide, doped silicon dioxide, silicon nitride, tantalum, copper, polysilicon, ceramics, aluminum/copper mixtures, gallium arsenide and other such Group III/V compounds. The substrate may also comprise the layered material of other polymeric materials, including antireflective coatings.

The photoresist solutions used to coat the substrate can be any one of those known in the prior art, providing the photoresist films are dissolvable in the mixtures of the invention. Typically photoresists can be positive or negative acting, in that the image-wise exposed portion of the photoresist either is removed or remain on the substrate upon development. Positive acting resist films can be based on novolak or polyhydroxystyrene resins and photoacid generators, such as o-quinone diazide. Typical photosensitive compounds are diazonaphthoquinones which are obtained by reacting 2,1,5, and/or 2,1,4 naphthoquinone diazides with polyhydroxyphenolic compounds. Multihydroxybenzophenones, multihydroxyphenyl alkanes and phenolic oligomers are examples of the many types of ballast groups used. Additionally, the diazo compounds can be reacted with alkali-soluble resins. Partially or fully capped polyvinyl phenol resins or novolaks and photoacid generators, where the capping compound is one that is removed in the presence of an acid, can also form photoresist films. Additives can also be incorporated into these photoresist compositions which improve performance characteristics, such as dyes, dissolution inhibitors, photo-speed enhancers, striation-free additives, etc. Solvents for the photoresist composition, such as propylene glycol monomethyl ether acetate, propylene glycol mono-alkyl ether, ethylene gylcol monoethyl ether acetate, ethyl lactate, ethyl ethoxy proprionate, 2-heptanone, butyl acetate, xylene, diglyme or mixtures of solvents can be used.

Any conventional coating process may be employed to apply the photoresist solution to the substrate. The coated film, which can be optionally baked to substantially remove the photoresist solvent, is then processed on a track equipped with the ability to do edge bead removal. After the edge bead removal, the coated substrate may be subjected to conventional lithographic processing (e.g. soft baking, image-wise exposure and development of the image). The specific process parameters for each of these subsequent steps will depend upon many factors and it is within the skill of an ordinary skilled artisan to choose the best parameters.

The following specific examples will provide detailed illustrations of the methods of utilizing compositions of the present invention. These examples are not intended, however, to limit or restrict the scope of the invention in any way and should not be construed as providing conditions, parameters or values which must be utilized exclusively in order to practice the present invention.

EXAMPLES

Comparative Example 1

A 150 mm silicon wafer was spin coated with a liquid positive-working photoresist composition based on a novolak resin and an o-quinonediazide photoactive compound, AZ® 7800 Photoresist, (commercially available from Hoechst Celanese Corporation, Somerville, N.J.), using a commercially available Opti-Track™ Coat/Bake spin coating unit. The substrate was baked at 90° C. for 60 seconds on a hot plate to give a film thickness of 1.3 microns. The edge bead removal solvent, pure ethyl lactate, was applied by combined front/backside application using the following program:

| \multicolumn{4}{c}{Program for Combined Front/Back EBR (edge bead remover)} |
| --- | --- | --- | --- |
| STEP | ACTION | TIME (seconds) | RPM |
| 1 | Spin | 1.5 | 400 |
| 2 | Back Dispense | 2.5 | 400 |
| 3 | Spin | 1.5 | 800 |
| 4 | Front Dispense | 2.5 | 800 |
| 5 | Spin | 1.5 | 800 |
| 6 | Front Dispense | 2.5 | 800 |
| 7 | Spin | 1.5 | 800 |
| 8 | Front Dispense | 2.5 | 800 |
| 9 | Spin | 2.5 | 800 |
| 10 | Spin Dry | 40 | 1000 |

The processed wafers were evaluated for the quality of the edge bead removal process using a microscope with an attached video camera. The results are given in Table 1.

Example 3

A mixture of 95 weight % of ethyl lactate and 5 weight % of N-methyl pyrollidone was evaluated as an edge bead remover using the same process as in Example 1. The results are given in Table 1.

Example 4

A mixture of 93 weight % of ethyl lactate and 7 weight % of N-methyl pyrollidone was evaluated as an edge bead remover using the same process as in Example 1. The results are given in Table 1.

Example 5

A mixture of 90 weight % of ethyl lactate and 10 weight % N-methyl pyrollidone was evaluated as an edge bead remover using the same process as in Example 1. The results are given in Table 1.

We claim:

1. A process for removing photoresist edge bead and forming an image in the photoresist comprising the steps of:
   a) forming a photoresist film on a substrate;
   b) applying a photoresist edge bead remover, where the edge bead remover comprises a mixture of N-methyl pyrollidone and ethyl lactate;
   c) imagewise exposing the photoresist film;
   d) developing the photoresist film; and
   e) optionally heating the film before or after the developing step.

2. The process according to claim 1, wherein the photoresist edge bead remover comprises a mixture of about 3 weight percent to about 10 weight percent of N-methyl pyrollidone.

3. The process acccording to claim 1, wherein the photoresist edge bead remover functions as backside and a frontside edgebead remover.

4. The process acccording to claim 1, wherein the photoresist film comprises a photoactive compound and a resin.

5. The process according to claim 4, wherein the photoactive compound is a naphthoquinone diazide.

6. The process acccording to claim 4, wherein the resin is a novolak resin.

7. The process acccording to claim 1, wherein the flashpoint of the photoresist edge bead remover is greater than 100° F. (38° C.).

TABLE 1

| | \multicolumn{7}{c}{Evaluation of EBR for Front/Back Rinse} |
| --- | --- | --- | --- | --- | --- | --- |
| | Chemical Composition | | Test Results | Performance Characteristics | | |
| Example | Ethyl Lactate | N-methyl-2-pyrrolidone | Front/Back Rinse | Flashpoint | Odor Threshold | Color |
| 1 | 100% | 0% | failed[1] | 126° F., PM[3] | 730000 | colorless |
| 2 | 0% | 100% | N.A. | 199° F., TAG[4] | 41000 | colorless |
| 3 | 95% | 5% | passed | 138° F., PM | 695550 | colorless |
| 4 | 93% | 7% | passed | 139° F., PM | 681770 | colorless |
| 5 | 90% | 10% | failed[2] | 140° F., PM | 661100 | colorless |

[1]solvent failed to remove required edge bead width
[2]solvent did not dry in required time, but would pass if drying time were sufficient
[3]PM - Penske Marteen method of measuring flash points
[4]TAG - TAG closed cup method of measuring flash point

Example 2

Pure N-methyl pyrollidone was evaluated as an edge bead remover using the same process as in Example 1. The results are given in Table 1.

8. The process acccording to claim 1, wherein the odor threshold of the photoresist edge bead remover is greater than 5000.

9. The process acccording to claim 1, wherein the odor threshold of the photoresist edge bead remover is greater than 10,000.

10. The process acccording to claim 1, wherein the odor threshold of the photoresist edge bead remover is greater than 50,000.

11. The process of claim 1, wherein a developer for the developing step comprises an aqueous solution of tetramethyl ammonium hydroxide.

12. The process of claim 1, further comprising heating said coated substrate from a temperature of from about 90° C. to about 150° C. for from about 30 seconds to about 180 seconds on a hot plate or from about 15 minutes to about 40 minutes in an oven after the exposure step but before the developing step.

13. The process of claim 1, further comprising heating said coated substrate at a temperature of from about 90° C. to about 150° C. for about 30 seconds to about 180 seconds on a hot plate or for from about 15 minutes to about 40 minutes in an oven after the developing step.

14. The process of claim 1, wherein said substrate comprises one or more components selected from the group consisting of silicon, aluminum, polymeric resins, silicon dioxide, doped silicon dioxide, silicon nitride, tantalum, copper and polysilicon.

\* \* \* \* \*